United States Patent
Choi

(10) Patent No.: US 6,718,157 B1
(45) Date of Patent: Apr. 6, 2004

(54) APPARATUS FOR COMMONLY USING ANTENNA FOR CALL SIGNAL AND TELEVISION BROADCASTING SIGNAL IN RADIO COMMUNICATION TERMINAL

(75) Inventor: Teak-Kyun Choi, Kumi-shi (KR)

(73) Assignee: Samsung Electronics Co., Ltd. (KR)

( * ) Notice: Subject to any disclaimer, the term of this patent is extended or adjusted under 35 U.S.C. 154(b) by 539 days.

(21) Appl. No.: 09/718,535

(22) Filed: Nov. 22, 2000

(30) Foreign Application Priority Data

Nov. 22, 1999 (KR) ........................... 1999-51826

(51) Int. Cl.[7] ............... H04B 1/38; H04B 1/18
(52) U.S. Cl. ............ 455/3.01; 455/82; 455/83; 455/284; 455/556.1; 348/14.01; 348/553; 333/126; 333/129; 333/132; 333/134; 343/858; 343/861; 343/862; 343/864
(58) Field of Search .............. 455/3.01, 82, 83, 455/283, 289, 280, 290, 285; 343/858, 861, 862, 864; 333/126, 129, 132, 134; 348/14.01, 553

(56) References Cited

U.S. PATENT DOCUMENTS 5,550,754 A * 8/1996 McNelley et al. ....... 348/14.01
5,978,039 A * 11/1999 Usui et al. ............... 348/553
6,253,070 B1 * 6/2001 Andrews ................. 455/287

* cited by examiner

Primary Examiner—Nay Maung
Assistant Examiner—Alan T. Gantt
(74) Attorney, Agent, or Firm—Dilworth & Barrese, LLP

(57) ABSTRACT

Disclosed is an apparatus for commonly using an antenna for a call signal and a television (TV) broadcasting signal in a radio communication terminal including an antenna, a phone duplexer, a TV tuner, an LC parallel circuit, connected between the antenna and the phone duplexer, for forming an LC resonance circuit for a call signal frequency band, an LC series circuit connected to a connected point of the LC parallel circuit and the antenna and to a DC power supply terminal, a stub for impedance matching one terminal of which is connected between a capacitor and an inductor of the LC series circuit and the other terminal of which is connected to the TV tuner, and a path providing section for providing a path between a connected point of the stub and the TV tuner and a ground terminal in accordance with a switching control signal provided according to a TV or call operating mode.

6 Claims, 2 Drawing Sheets

APPARATUS FOR COMMONLY USING ANTENNA FOR CALL SIGNAL AND TELEVISION BROADCASTING SIGNAL IN RADIO COMMUNICATION TERMINAL

BACKGROUND OF THE INVENTION

1. Field of the Invention

The present invention relates generally to a radio communication terminal, and more particularly to an antenna of a radio communication terminal that can receive and transmit a call communication signal but also receive a television (TV) broadcasting signal.

2. Description of the Related Art

Generally, with the rapid development of networks for providing information, the development of a composite radio communication terminal having diverse functions in addition to the audio transferring function has been required. Accordingly, a composite radio communication terminal containing a portable terminal for viewing TV in addition to the audio transmitting/receiving function (hereinafter referred to as a TV phone) has been developed. An example of such a TV phone is contained in a Korean Patent Application bearing application number 1999-31824, entitled "Information Display Method in a TV Phone", and filed by the applicant herein.

Since the TV phone needs to receive a TV broadcasting signal as well as being capable of the transmission/reception of an audio signal, a problem is created in designing an antenna and associated circuitry for receiving both types of signals.

FIG. 1 is a block diagram illustrating an antenna structure of a conventional TV phone for receiving an audio call signal and a TV broadcasting signal. Referring to FIG. 1, the TV phone 10 includes an antenna ANT_T for receiving the TV broadcasting signal, and an antenna ANT_P for transmitting and receiving a code division multiple access (CDMA) audio signal used in a typical digital portable phone. The antenna ANT_T for receiving the TV broadcasting signal is connected to a TV tuner 12 in the TV phone 10, and the antenna ANT_P for transmitting and receiving the audio signal is connected to a phone duplexer 14 in the TV phone 10. Though having the respective antennas for the audio signal and the TV broadcast signal achieves good receiving sensitivity for the call signal and the TV broadcasting signal, it creates a problem in designing a low-priced and small-sized radio terminal.

FIG. 2 is a view illustrating another antenna structure of a conventional TV phone for receiving an audio call signal and a TV broadcasting signal. According to the antenna structure of FIG. 2, a general antenna ANT is used for transmitting and receiving of the CDMA audio signal and receiving the TV broadcast signal. Specifically, the antenna ANT of the TV phone 10 is connected to the phone duplexer 14, and to the TV tuner 12 through band pass filter 16. The band pass filter 16 filters and outputs to the TV tuner 12 the TV broadcasting frequency received through the antenna ANT. Though using a conventional CDMA phone antenna for receiving the TV broadcasting signal may reduce the problem in designing a low-priced radio terminal, the receiving sensitivity of the TV broadcasting signal is compromised since the construction of the antenna is designed for receiving the CDMA audio signal

SUMMARY OF THE INVENTION

Accordingly, the present invention solves the problems inherent in the related art, and an object of the present invention is to provide an apparatus for commonly using a single antenna for an audio call signal and a TV broadcasting signal in a radio communication terminal TV phone which improves the receiving sensitivity of both the TV broadcasting signal and the call signal at a low cost.

It is another object of the present invention to provide an apparatus for commonly using an antenna for a call signal and a TV broadcasting signal in a radio communication terminal which improves the receiving sensitivity of both the TV broadcasting signal and the call signal with its construction simplified and small-sized.

In order to achieve the above objects, according to the present invention, there is provided an apparatus for commonly using an antenna for a call signal and a TV broadcasting signal in a radio communication terminal having an antenna, a phone duplexer, and a TV tuner, the apparatus comprising an LC parallel circuit connected between the antenna and the phone duplexer for forming an LC resonance circuit for a call signal frequency band, an LC series circuit connected to a connection point of the LC parallel circuit and the antenna and to a DC power supply terminal, a stub for TV broadcast signal impedance matching one terminal of which is connected between a capacitor and an inductor of the LC series circuit and the other terminal which is connected to the TV tuner, and a path providing section for providing a path between a connected point of the stub and the TV tuner and a ground terminal in accordance with a switching control signal provided according to a TV or call operating mode.

BRIEF DESCRIPTION OF THE DRAWINGS

The above objects and advantages of the present invention will become more apparent by describing in detail the preferred embodiment thereof with reference to the attached drawings in which.

DETAILED DESCRIPTION OF THE PREFERRED EMBODIMENT

The preferred embodiment of the present invention will now be explained in detail with reference to the accompanying drawings. In the following description of the present invention, many specified items such as detailed constituent elements are indicated, but they are provided only for the whole understanding of the present invention and thus it will be apparent by those skilled in the art that other modifications or changes thereof may be made without departing from the scope and spirit of the present invention.

Figure 1:
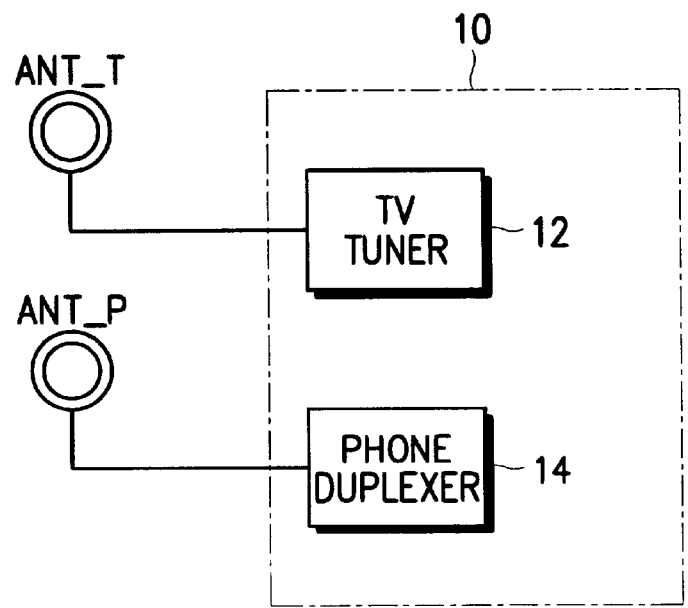
FIG. 1 is a block diagram illustrating a conventional antenna structure of a radio communication terminal for receiving a call signal and a TV broadcasting signal.
Figure 2:
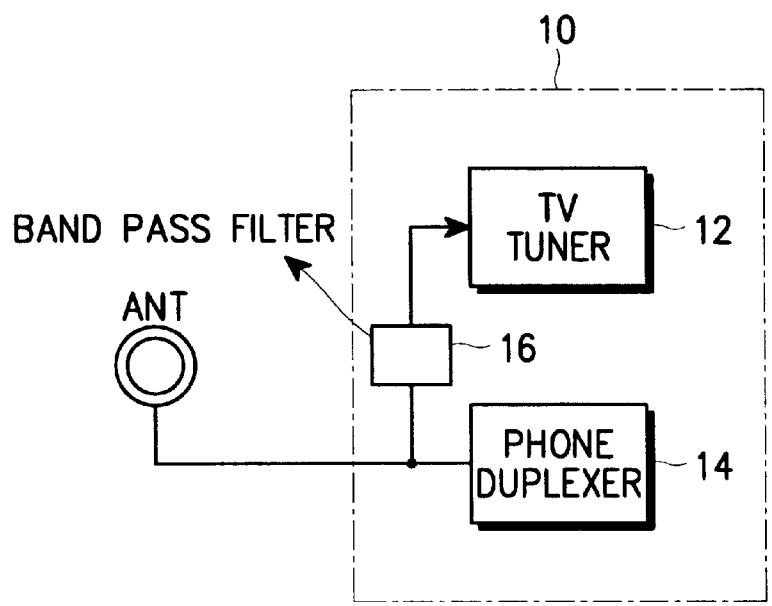
FIG. 2 is a block diagram illustrating another conventional antenna structure of a radio communication terminal for receiving a call signal and a TV broadcasting signal.
Figure 3:
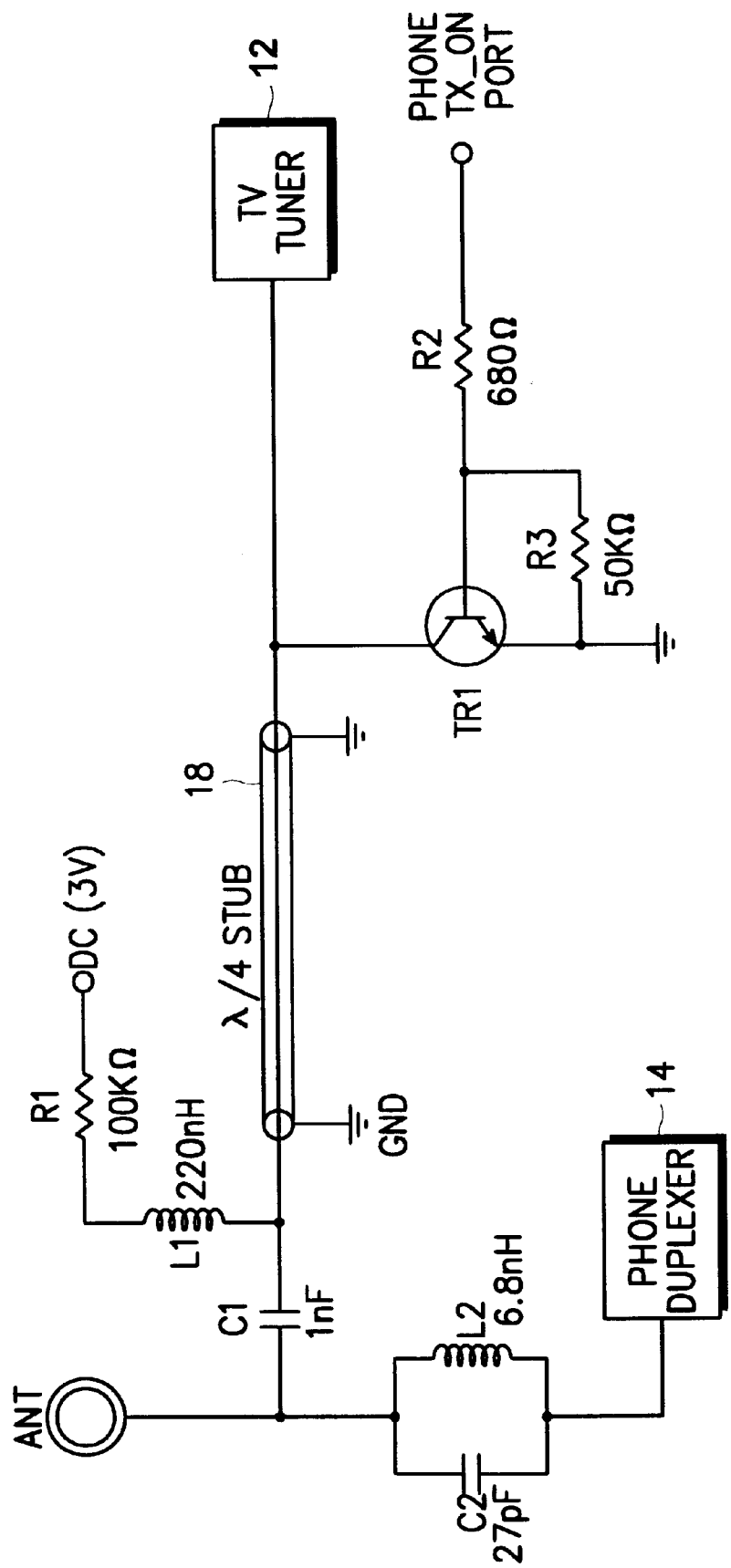
FIG. 3 is a schematic circuit diagram illustrating an apparatus for commonly using an antenna for a call signal and a TV broadcasting signal in a radio communication terminal according to an embodiment of the present invention.

FIG. 3 is a schematic circuit diagram illustrating an apparatus for commonly using an antenna for a call signal and a TV broadcasting signal in a radio communication terminal according to an embodiment of the present invention. Referring to FIG. 3, the apparatus for commonly using an antenna for the call signal and the TV broadcasting signal in the radio communication terminal includes an antenna ANT for receiving and transmitting a CDMA audio signal and receiving the TV broadcasting signal, an LC parallel circuit connected to the antenna for forming an LC resonance circuit for the CDMA audio signal frequency band, a phone duplexer 14 connected to an output terminal of the LC parallel circuit, and an LC series circuit connected to a connection point of the LC parallel circuit and the antenna ANT for receiving a DC power supply through a resistor R1.

The apparatus according to the preferred embodiment of the present invention also includes a λ/4 stub 18 for impedance matching. The stub can be implemented by a semi-rigid cable. One terminal of the stub is connected between a first capacitor C1 and a first inductor L1 of the LC series circuit, and the other terminal of the stub is connected to the TV tuner 12. A path providing section for connecting and disconnecting a connection point of the stub 18 and the TV tuner 12 to and from a ground terminal GND is also provided. A switching control signal PHONE TX_ON PORT controls the circuit according to the operating mode of the TV phone, that is, whether the TV phone is in a TV mode, call communication mode, or reception standby mode.

The path providing section comprises an NPN-type switching transistor TR1. The collector is connected to the connection point of the stub 18 and the TV tuner 12, the emitter is connected to the ground terminal, and the base is connected to receive the switching control signal PHONE TX_ON PORT through a second resistor R2. The switching transistor TR1 operates in the frequency range of 800 MHz, and its base and emitter may be connected together through a third transistor R3.

The LC parallel circuit connected between the antenna ANT and the phone duplexer 14 comprises a second capacitor C2 of 27 pF and a second inductor L2 of 6.8 nH. The LC series circuit that is connected to the LC parallel circuit and the antenna ANT and is provided with the DC power supply of 3V comprises a first capacitor C1 of 1 nF and a first inductor L1 of 220 nH. The first resistor R1 has a value of 100 KΩ, the second resistor R2 connected to the base of the transistor TR1 of the path providing section has a value of 680 KΩ, and the third resistor R3 has a value of 50 KΩ.

In the TV phone according to the preferred embodiment of the present invention, a TV circuit module for a TV mode for performing the viewing the TV broadcasting signal, a call circuit module for a call mode, and a reception standby mode for performing a call are provided. A mobile station processor (not shown), which is a control section, outputs a "high" or "low" level signal PHONE TX_ON PORT in accordance with the operation modes of the respective modules. This signal is provided as the switching control signal of the path providing section.

Hereinafter, the operation of the apparatus for commonly using an antenna for a call signal and a TV broadcasting signal according to the embodiment of the present invention will be explained in detail in accordance with the respective operation modes.

First, in the call communication mode, the audio signal transmitting and receiving section of the TV phone is in an "on" state, and the PHONE TX_ON PORT is in a "high" state. As a result, the switching transistor TR1 of the path providing section is turned on. As the switching transistor TR1 is turned on, the terminal of the stub 18 connected to the TV tuner 12 is short-circuited to ground, and high impedance is produced from the phone duplexer 14 to the TV tuner 12. Accordingly, the transmitted audio signal cannot be transferred to the TV tuner 12. In this mode the TV module of the TV phone 10 can only receive TV broadcast signals of in the VHF band and only if the TV phone is in a location where there is a strong TV broadcast signal because the stub 18 does not act with a high impedance in this TV frequency band.

In the reception standby mode, the PHONE TX_ON PORT is in a "low" state. The switching transistor TR1 is turned off, and the terminal of stub 18 connected to the TV tuner 12 is in a low impedance state. The received signal is transferred to the ground terminal. The open stub 18 acts on the ground terminal with a low impedance, but if it is finally connected to the phone duplexer 14, its impedance moves to 50Ω, somewhat degrading the receiving sensitivity of the phone.

In the TV mode, the same operation as in the reception standby mode is performed. In this mode, the LC series resonance is generated in a specified frequency band among the received TV frequencies, i.e., in the band of 450 MHz, and the TV broadcasting signal proceeds to the TV tuner 12 through the stub 18, so that the reception of the TV broadcasting signal is possible.

As described above, it will be apparent that the apparatus for commonly using an antenna for the TV broadcasting signal and the call signal according to the present invention provides the advantages that it can improve the receiving sensitivity of the TV broadcasting signal and the call signal using a single antenna at a low cost and with its construction simplified and small-sized.

While this invention has been described in connection with what is presently considered to be the most practical and preferred embodiment, it is to be understood that other modifications thereof may be made without departing from the scope of the invention. Thus, the invention should not be limited to the disclosed embodiment, but should be defined by the scope of the appended claims and their equivalents.

What is claimed is:

1. An apparatus for commonly using an antenna for a call signal and a television (TV) broadcasting signal in a radio communication terminal having an antenna, a phone duplexer, and a TV tuner, the apparatus comprising:

an LC parallel circuit, connected between the antenna and the phone duplexer, for forming an LC resonance circuit for a call signal frequency band;

an LC series circuit connected to a connection point of the LC parallel circuit and the antenna and to a DC power supply terminal;

a stub for impedance matching, one terminal of which is connected between a capacitor and an inductor of the LC series circuit and the other terminal of which is connected to the TV tuner; and a path providing section for providing a path between a connection point of the stub and the TV tuner and a ground terminal in accordance with a switching control signal provided when the terminal is in a TV or call operating mode.

2. The apparatus as claimed in claim 1, wherein the path providing section comprises a switching transistor whose collector is connected to the connection point of the stub and the TV tuner, whose emitter is connected to the ground terminal, and whose base is connected to receive the switching control signal.

3. A television (TV) phone having an antenna, a phone duplexer, a TV tuner, and a DC power source, comprising:

an LC parallel circuit;

an LC series circuit;

a stub;

means for connecting said LC parallel circuit between said antenna and said phone duplexer;

means for connecting said LC series circuit between said antenna and said DC power source; and means for connecting said stub between a connection point between a capacitor and an inductor of said LC series circuit and said TV tuner.

4. The apparatus of claim 3, further comprising a switch connected between a connection point of said stub and said TV tuner and ground.

5. The apparatus of claim 4, wherein the switch is a transistor.

6. A method of receiving and transmitting a call signal and receiving a television (TV) broadcast signal in a TV phone having an antenna, a phone duplexer, and a TV tuner, comprising the steps of:

switching said TV phone into one of a TV mode, a call mode and a standby mode;

receiving a signal; and routing said signal to one of said phone duplexer and said TV tuner, wherein said signal is routed through a stub to said TV tuner when the TV phone is in said TV mode.

* * * * *